(12) United States Patent
Gozzi et al.

(10) Patent No.: US 9,899,967 B1
(45) Date of Patent: Feb. 20, 2018

(54) EMBEDDED HARMONIC TERMINATION ON HIGH POWER RF TRANSISTOR

(71) Applicant: Infineon Technologies AG, Neubiberg (DE)

(72) Inventors: Cristian Gozzi, Santa Clara, CA (US); Guillaume Bigny, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/421,567

(22) Filed: Feb. 1, 2017

(51) Int. Cl.
| | |
|---|---|
| *H03F 3/04* | (2006.01) |
| *H03F 1/56* | (2006.01) |
| *H03F 3/213* | (2006.01) |
| *H03F 3/195* | (2006.01) |
| *H01L 21/768* | (2006.01) |

(52) U.S. Cl.
CPC ......... *H03F 1/56* (2013.01); *H01L 21/76898* (2013.01); *H03F 3/195* (2013.01); *H03F 3/213* (2013.01); *H03F 2200/391* (2013.01); *H03F 2200/451* (2013.01)

(58) Field of Classification Search
USPC .................. 330/303, 307, 277, 305
See application file for complete search history.

(56) References Cited

U.S. PATENT DOCUMENTS 7,880,549 B1 * 2/2011 Tserng .................... H03F 3/193
330/303

OTHER PUBLICATIONS

Hong, Jia-Sheng et al., "A General Circuit Model for Defected Ground Structures in Planar Transmission Lines", IEEE Microwave and Wireless Components Letters, vol. 15, No. 10, Oct. 2005, pp. 706-708.

* cited by examiner

*Primary Examiner* — Hieu Nguyen
(74) *Attorney, Agent, or Firm* — Murphy, Bilak & Homiller, PLLC

(57) ABSTRACT

A semiconductor includes a semiconductor substrate having first and second opposite facing surfaces. An amplifier device is formed in the semiconductor substrate, the amplifier device is configured to amplify an RF signal at a fundamental frequency. A first dielectric layer is formed on the first surface of the substrate. A first metallization layer is formed on the first dielectric layer. The first metallization layer is spaced apart from the substrate by the first dielectric layer. The first metallization layer includes a first elongated finger interdigitated with a first reference potential pad. The first elongated finger is physically disconnected from the first reference potential pad. The first reference potential pad includes a first patterned shape that is devoid of metallization. The first patterned shape has a geometry that filters harmonic components of the fundamental frequency.

17 Claims, 10 Drawing Sheets

EMBEDDED HARMONIC TERMINATION ON HIGH POWER RF TRANSISTOR

FIELD OF TECHNOLOGY

The present application relates to RF (radio frequency) amplifiers, and in particular relates to impedance matching networks for RF amplifiers.

BACKGROUND

RF power amplifiers are used in a variety of applications such as base stations for wireless communication systems, etc. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher. Many RF power amplifier designs utilize a semiconductor switching device as the amplification device. Examples of these switching devices include power transistor devices, such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), an LDMOS transistor, etc.

Class F amplifier configurations are gaining increased favor in modern RF applications due to their highly efficient operation. In class F operation, the input of the switching device (e.g., the gate) is modulated while a reference terminal of the switching device (e.g., the source) is maintained at a fixed potential. During the ON state of the switching device, voltage is nominally at zero across the output of the switching device while a sinusoidal switching current is present across the output terminal of the switching device. Conversely, During the OFF state of the switching device, current is nominally at zero across the output of the switching device while a half square wave voltage appears at the output terminal of the switching device. Theoretically, no power is dissipated because both states are characterized by zero IV. In practice, power dissipation occurs at the transition between ON and OFF states when there is an overlap between the current sine wave and the voltage square wave and hence current and voltage simultaneously appear at the output terminal. Highly efficient class F operation is obtained by minimizing this overlap.

One technique for minimizing the current-voltage overlap in class F amplifiers involves harmonic filtering. By mitigating harmonic oscillation at the output of the device, the shape the voltage and current waveforms is beneficially improved for minimal overlap. Nominally, the output of the amplifier should present a short circuit path to the even ordered harmonics (e.g., $2F_0$, $4F_0$, $6F_0$, etc) of the fundamental frequency $F_0$, i.e., the frequency of the RF signal being amplified. In addition, the output of the amplifier should nominally present an open circuit to the odd ordered harmonics (e.g., $3F_0$, $5F_0$, $7F_0$, etc.) of the fundamental RF frequency $F_0$.

Known techniques for harmonic tuning of Class F amplifiers include incorporating filters into the impedance matching networks that are connected to the input and output terminals of the amplifier device. These impedance matching networks can be provided on a printed circuit board (PCB) that accommodates the packaged amplifier device. Alternatively or in addition, filters can be incorporated into the packaged amplifier device itself by placing discrete capacitors and inductors between the integrated circuit and the package leads. In either case, the impedance matching networks can include LC filters that are tuned to the harmonics of the fundamental frequency $F_0$ so as to provide an electrical short or open circuit, as the case may be. Instead of LC components, microstripline geometries, such as quarter wavelength transmission lines, open stubs, radial stubs, etc. may be used in the PCB to provide a desired frequency response.

One drawback of conventional harmonic tuning designs is that higher order harmonics become increasingly difficult to filter with increasing separation from the current source. For example, in the above described configurations, parasitic reactance of the package level and board level conductors substantially influences the propagation of higher frequency signals. As a result, the ability to tune out a third order harmonic, which may be in the range of 6 GHz in modern RF applications, is very limited at the package level or board level.

SUMMARY

A semiconductor device is disclosed. According to an embodiment, the semiconductor device includes a semiconductor substrate having first and second opposite facing surfaces. An amplifier device is formed in the semiconductor substrate, the amplifier device is configured to amplify an RF signal at a fundamental frequency. A first dielectric layer is formed on the first surface of the substrate. A first metallization layer is formed on the first dielectric layer. The first metallization layer is spaced apart from the substrate by the first dielectric layer. The first metallization layer includes a first elongated finger interdigitated with a first reference potential pad. The first elongated finger is physically disconnected from the first reference potential pad. The first reference potential pad includes a first patterned shape that is devoid of metallization. The first patterned shape has a geometry that filters harmonic components of the fundamental frequency.

An integrated circuit is disclosed. According to an embodiment, the integrated circuit includes a semiconductor substrate having first and second opposite facing surfaces. An RF transistor is formed in the semiconductor substrate. The RF transistor is configured to operate at a fundamental frequency, and includes a control terminal, output terminal and an reference potential terminal. An externally accessible control terminal is electrically connected to the control terminal. An externally accessible output terminal is electrically connected to the output terminal. An externally accessible reference potential is electrically connected to the reference potential. A first patterned shape that is devoid of metallization is formed in a back end of the line metallization layer of the integrated circuit. The first patterned shape has a geometry that filters harmonic components of the fundamental frequency.

A method of forming a semiconductor device is disclosed. According to an embodiment, the method includes providing a semiconductor substrate having first and second opposite facing surfaces and an amplifier device that is configured to operate at a fundamental frequency. The amplifier device includes a control terminal, an output terminal and a reference potential terminal. A back end of the line metallization layer is formed on the semiconductor substrate. A first patterned shape is formed in the back end of the line metallization layer. The first patterned shape has a geometry that filters harmonic components of the fundamental frequency.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, an integrated circuit includes an amplifier device formed in the semiconductor body and harmonic filtering structures incorporated into the back end of the line metallization of the integrated circuit. The amplifier device operates at fundamental frequency $F_0$. The back end of the line metallization is structured in such a manner so as to provide a non-linear impedance response that is tuned to fundamental frequency $F_0$. According to one particular embodiment, the back end of the line metallization is structured to provide low impedance to the second order harmonic $2F_0$ of the fundamental frequency $F_0$ high impedance to the third order harmonic $3F_0$ of the fundamental frequency $F_0$.

Harmonic filtering structures can be formed in the back end of the line metallization with a so-called coplanar waveguide configuration. In this configuration, a single metallization layer includes elongated fingers that are interdigitated with a metal pad. The elongated fingers carry the RF signal propagating form the output of the transistor device and the metal pad is connected to a reference potential (e.g., ground). Patterned shapes are formed in the metal pad to disrupt the ground plane of the coplanar waveguide and consequently provide a frequency dependent impedance response to the output of the amplifier. Advantageously, by incorporating the harmonic tuning filter directly into the integrated circuit, excellent performance can be obtained because there are minimal parasitic effects. Moreover, forming the harmonic tuning filter in the back end of the line metallization provides a low cost and simple solution in comparison to other techniques.

Figure 1:
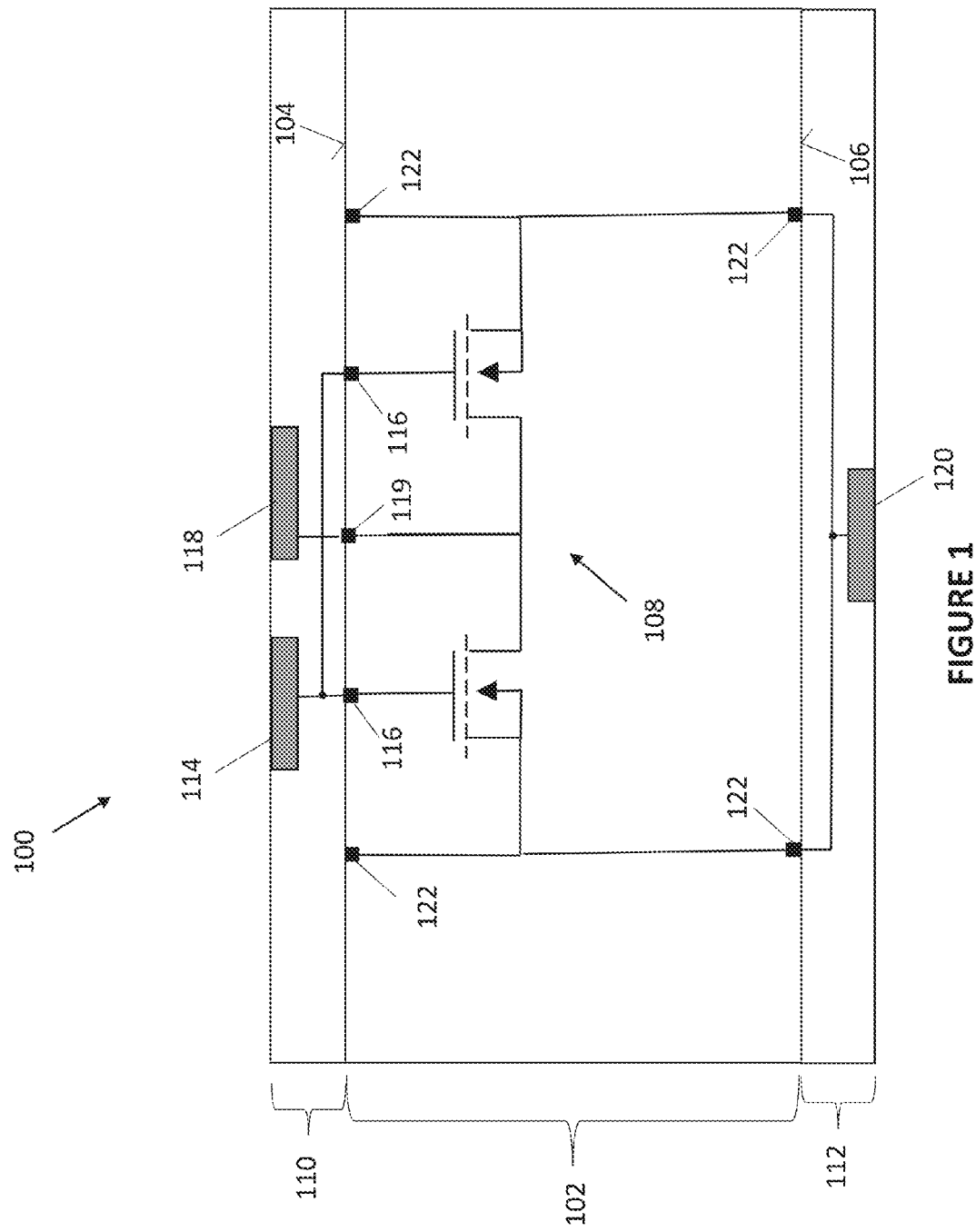
FIG. 1 depicts an integrated circuit with a semiconductor substrate, back end of the line portions and externally accessible terminals, according to an embodiment.

Referring to FIG. 1, an integrated circuit 100 is schematically illustrated. The integrated circuit 100 may be used as an amplifier device in an RF power amplifier application. The integrated circuit 100 includes a semiconductor substrate 102 having first and second opposite facing surfaces 104, 106. In general, the semiconductor substrate 102 can include any one or combination of a variety of semiconductor materials that are used to form integrated semiconductor devices such as silicon (Si), silicon germanium (SiGe), silicon carbide (SiC), gallium nitride (GaN), gallium aluminium nitride (GaAlN) or the like, for example.

At least one amplifier device 108 is formed in the semiconductor substrate 102. The amplifier device 108 is schematically depicted in the figures. Generally speaking, the amplifier device 108 can be any kind of semiconductor device that provides a current or voltage gain as between an input and output terminal. According to the embodiment depicted in FIG. 1, the amplifier device 108 is a transistor. A wide variety of transistor types are suitable for the amplifier device 108. Examples of these transistor types include power transistors such MOSFETs (metal-oxide semiconductor field-effect transistor), DMOS (double-diffused metal-oxide semiconductor) devicess, GaN HEMT (gallium nitride high electron mobility transistor), GaN MESFETs (gallium nitride metal-semiconductor field-effect transistor), LDMOS (laterally-diffused metal-oxide semiconductor) devices, etc. The transistor can be configured as a lateral device, i.e., a device that is configured to control a conductive current flowing in a direction that is parallel to the first and second surfaces 104, 106 or a vertical device, i.e., a device that is configured to control a conductive current flowing in a direction that is perpendicular to the first and second surfaces 104, 106. In the depicted embodiment, the transistor is configured as an n-type enhancement MOSFET. Alternatively, the transistor can be a p-type device and/or a depletion mode device The amplifier device 108 is configured to amplify an RF signal as between an input terminal and an output terminal. That is, the magnitude of the current and/or voltage of the RF signal that is applied to the input terminal is greater at the output terminal. In the depicted example, the input terminal is the gate of the transistor and the output terminal is the drain of the transistor. The source of the transistor is held at a fixed reference potential (e.g., GND). The amplifier device 108 is configured to operate at the fundamental frequency of the RF signal being amplified. Generally speaking, the fundamental frequency of the RF signal can be anywhere in the megahertz (MHz) to gigahertz (GHz) range. According to more particular embodiments, the RF signal is in the low gigahertz (GHz) range, and even more particularly in the range of 1.8 GHz to 2.2 GHz, with a center frequency of about 2.0 GHz. In any case, the physical parameters of the device (e.g., channel dimensions, gate capacitance, etc.) are such that the amplifier device 108 can be switched at this fundamental frequency, and preferably at high gain.

The integrated circuit 100 additionally includes BEOL (back end of the line) portions 110, 112 that are formed on the first and second surfaces 104, 106 of the substrate. As is commonly understood in the art, BEOL refers to the second step of semiconductor fabrication that occurs after FEOL (front end of the line) semiconductor fabrication. The FEOL portion of the integrated circuit 100 includes the semiconductor substrate 102 and the semiconductor devices that are formed therein (transistors, capacitors, resistors, trenches, edge termination structures, etc.). The BEOL portion of the substrate refers to the elements formed on the semiconductor substrate 102 and over the semiconductor devices formed therein. Examples of these elements include metallization layers, dielectric layers and conductive via structures.

The integrated circuit 100 includes an upper BEOL portion 110 that is formed on the first surface 104 of the substrate. The upper BEOL portion 110 can include any number of metallization layers (e.g., M1, M2, M3, etc.) that are formed from electrically conductive materials, such as copper, aluminum, and alloys thereof. These metallization layers are separated from one another by electrically insulating layers. Exemplary materials for these layers include silicon oxide ($SiO_2$), silicon nitride (SiN), and silicon oxynitrides ($SiO_xN_x$). Conductive via structures can be used to connect between the various metallization layers and to the semiconductor devices. These via structures can be made from tungsten or copper, for example.

The upper BEOL portion 110 is structured to provide electrical connectivity between the first surface 104 level device terminals of the transistor and externally accessible terminals. The first surface 104 level device terminals refer to the substrate level terminals of the transistor device (e.g., the source and drain regions and the gate electrode). The externally accessible terminals refer to conductive structures (e.g., bond pads) that are provided at an outermost side of the BEOL portions 110, 112 and are available for electrical connection to, e.g., a conductive bond wire or package lead. In the depicted example, an externally accessible control terminal 114 is electrically connected to a first surface 104 level control terminal 116 via the upper BEOL portion 110, and an externally accessible output terminal 118 is electrically connected to a first surface 104 level output terminal 119 via the upper BEOL portion 110.

The integrated circuit 100 additionally includes a lower BEOL portion 112 that is formed on the second surface 106 of the substrate. Similar to the upper BEOL portion 110, the lower BEOL portion 112 can include metallization layers, dielectric layers and conductive vias. Moreover, externally accessible terminals can be provided on an outer side of the lower BEOL portion 112 to provide electrical connectivity at a lower side of the integrated circuit 100. In the depicted example, an externally accessible reference potential terminal 120 is electrically connected to a second surface 106 level control terminal reference potential terminal 122 via the lower BEOL portion 112.

The arrangement of the externally accessible terminals and the electrical connectivity provided by the BEOL portions can be suitably adapted to meet a particular device type or packaging configuration. For instance, In the case of a lateral device, i.e., a device that is configured to conduct in a direction that is parallel to the first and second surfaces 104, 106, each of the surface level terminals 116, 119, 122 (e.g., the gate, source and drain terminals of the transistor) are disposed on the first surface 104 of the substrate. The upper BEOL portion 110 can be structured to provide electrical connectivity between each of these surface level terminals 116, 119, 122 and externally accessible terminals at an outer side of the upper BEOL portion 110. Many RF packages employ a two sided connection scheme in which at least one connection (e.g., source/GND) is effectuated at the bottom side of the integrated circuit 100. In the case of a lateral device, a through silicon via (TSV) can be used to provide an electrical connection between the surface level terminal 122 that is disposed on the first surface 104 of the substrate and the second surface 106, and the lower BEOL connects the through silicon via (TSV) to an external reference potential terminal 120. In the case of a vertical device, i.e., a device that is configured to conduct in a direction that is perpendicular to the first and second surfaces 104, 106, one of the output terminals (e.g., the source terminal) is already present at the second surface 106 of the substrate and thus the TSV is not necessary.

Figure 2:
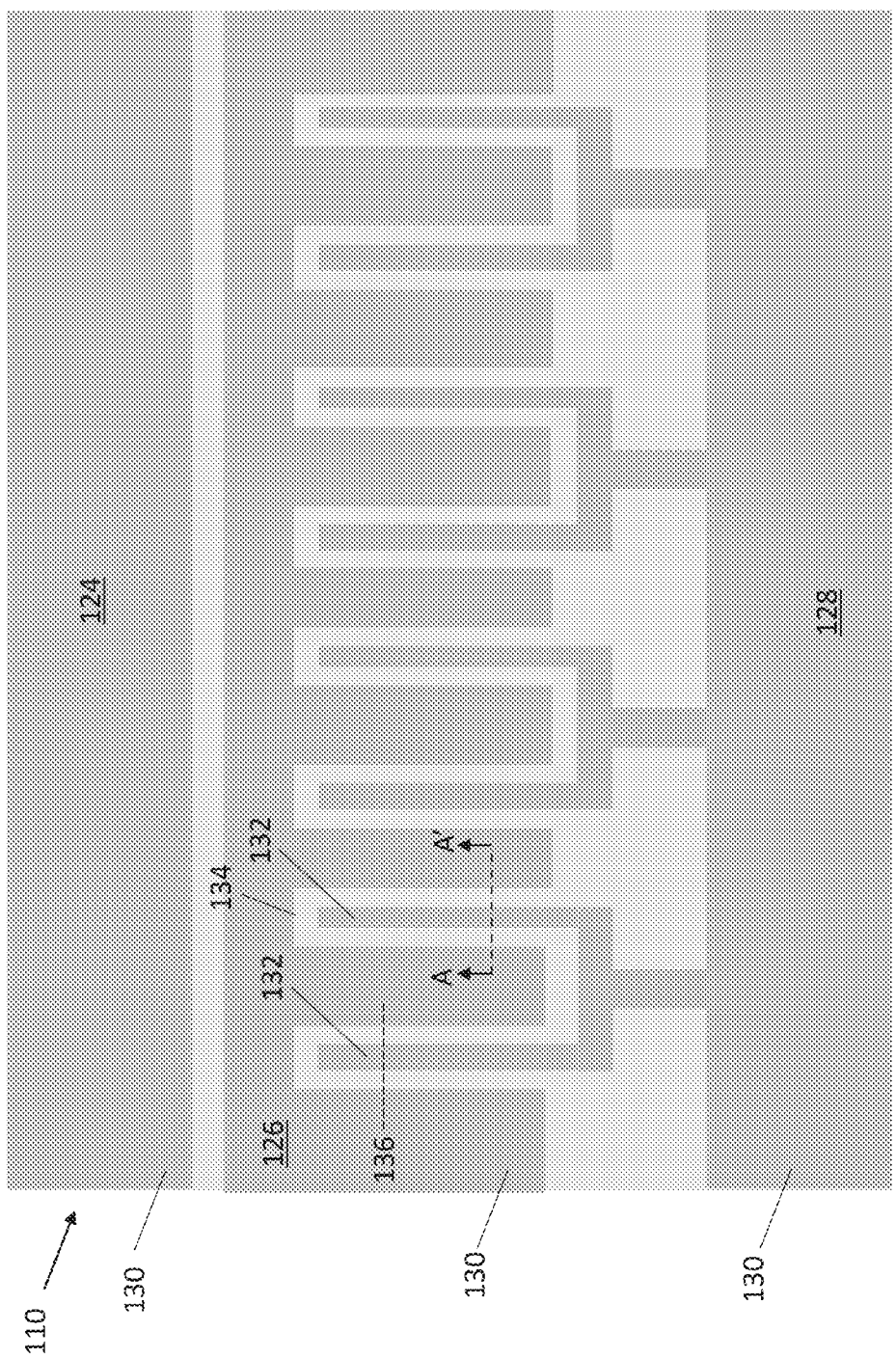
FIG. 2 depicts a plan view representation of a first metallization layer in the back end of the line portion of the integrated circuit, according to an embodiment.

Referring to FIG. 2, a plan-view perspective of a first metallization layer 130 of the upper BEOL of the integrated circuit 100 is depicted, according to an embodiment. The upper BEOL portion 110 includes three distinct metal pads that are electrically isolated from one another. Specially, the upper BEOL portion 110 includes a control terminal pad 124, a reference potential pad 126, and an output terminal pad 128. The control terminal pad 124 is electrically connected to the surface level control terminal 116 and to the external control terminal 114, the reference potential pad 126 is electrically connected to the surface level reference potential terminal 122 and to the external reference potential terminal 120, and the output terminal pad 128 is electrically connected to the surface level output terminal 122 of the transistor and to the external output terminal 120.

The first metallization layer 130 that has been structured to include a number of elongated fingers 132 that are directly connected to the output terminal pad 128. The elongated fingers 132 extend into voids 134 in the reference potential pad 126. As a result, the elongated fingers 132 are interdigitated with the reference potential pad 126. As used herein, interdigitated refers to an overlapping arrangement of two separate structures in in which a single plane intersects at least once with one structure and intersects at least once with the other structure. For instance, as shown in FIG. 2, a line 136 intersects with one of the elongated fingers 132 and with adjacent portions of the reference potential pad 126 on either side of the elongated finger 132.

The width of the elongated fingers 132 and the separation distance between elongated fingers 132 and the reference potential pad 126 can be at the minimum distance capability of the BEOL process. Meanwhile, the width of the adjacent portions of the reference potential pad 126 can be much greater, e.g., at least 10 times the minimum distance capability of the BEOL process.

The interdigitated configuration of the elongated fingers 132 and the reference potential pad 126 produces a coplanar wave guide. Generally speaking, a coplanar wave guide refers to a type of transmission line structure in which a narrow conductive track is separated from two much larger conductive planes, with both the conductive track and the conductive planes being on the same plane and being above a dielectric. An electrical signal is transmitted along the center conductive track and the adjacent conductive planes act as return paths. Nominally, the conductive planes behave as infinite ground planes. In this example, the central conductive track, which is provided by the elongated fingers 132, carries the RF signal that is being transmitted between the surface level output terminal 119 and the external output terminal 118. The reference potential pad 126, which is connected to the external reference potential terminal 120, provides the ground plane.

Figure 3:
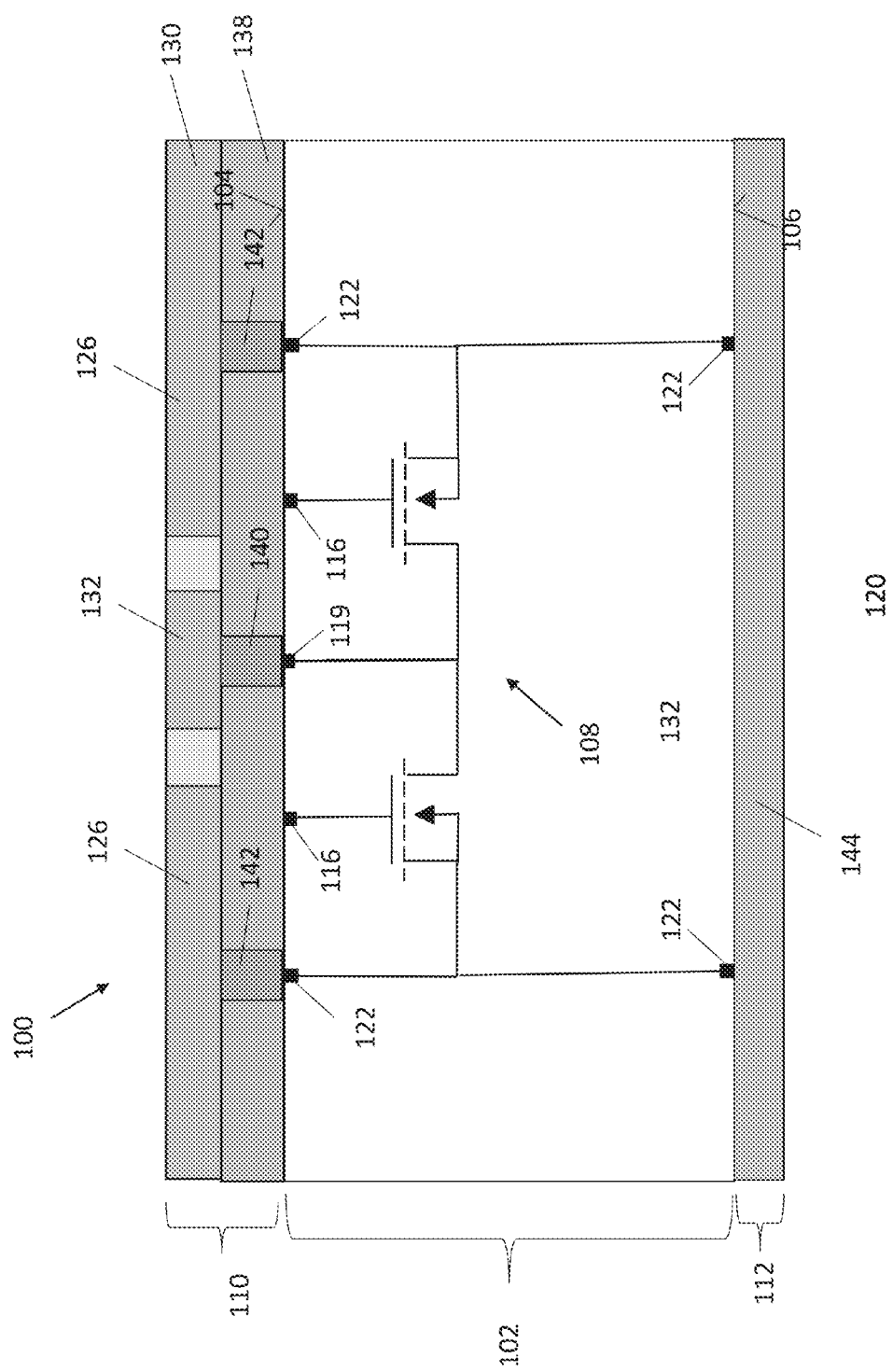
FIG. 3 depicts a cross sectional view of the integrated circuit of FIG. 2, according to an embodiment.

Referring to FIG. 3, a cross sectional view of the integrated circuit 100 of FIG. 2 along the line A-A' is depicted, according to an embodiment. In the figure, the substrate with a transistor schematically represented as described with reference to FIG. 1 is depicted.

In the upper BEOL portion 110, a first dielectric layer 138 is formed on the substrate 102, and the first metallization layer 130 is formed on the first dielectric layer 138. As a result, the first metallization layer 130 is spaced apart from the substrate 102 and is electrically insulated from the substrate 102 by the first dielectric layer 138. The upper BEOL portion 110 additionally includes electrically conductive via structures that are formed in openings of the first dielectric layer 138. A first via 140 electrically connects the first surface 104 level output terminal 119 of the transistor to one of the elongated fingers 132. Second vias 142 electrically connect the first surface 104 level reference potential terminal 122 of the transistor to the first reference potential pad 126.

The lower BEOL portion 112 includes a third metallization layer 144 that is formed on the second surface 106. According to an embodiment, the third metallization layer 144 is the only layer in the lower BEOL portion 112. In this configuration, the third metallization layer 144 is externally accessible and thus provides the external reference potential terminal.

Figure 4:
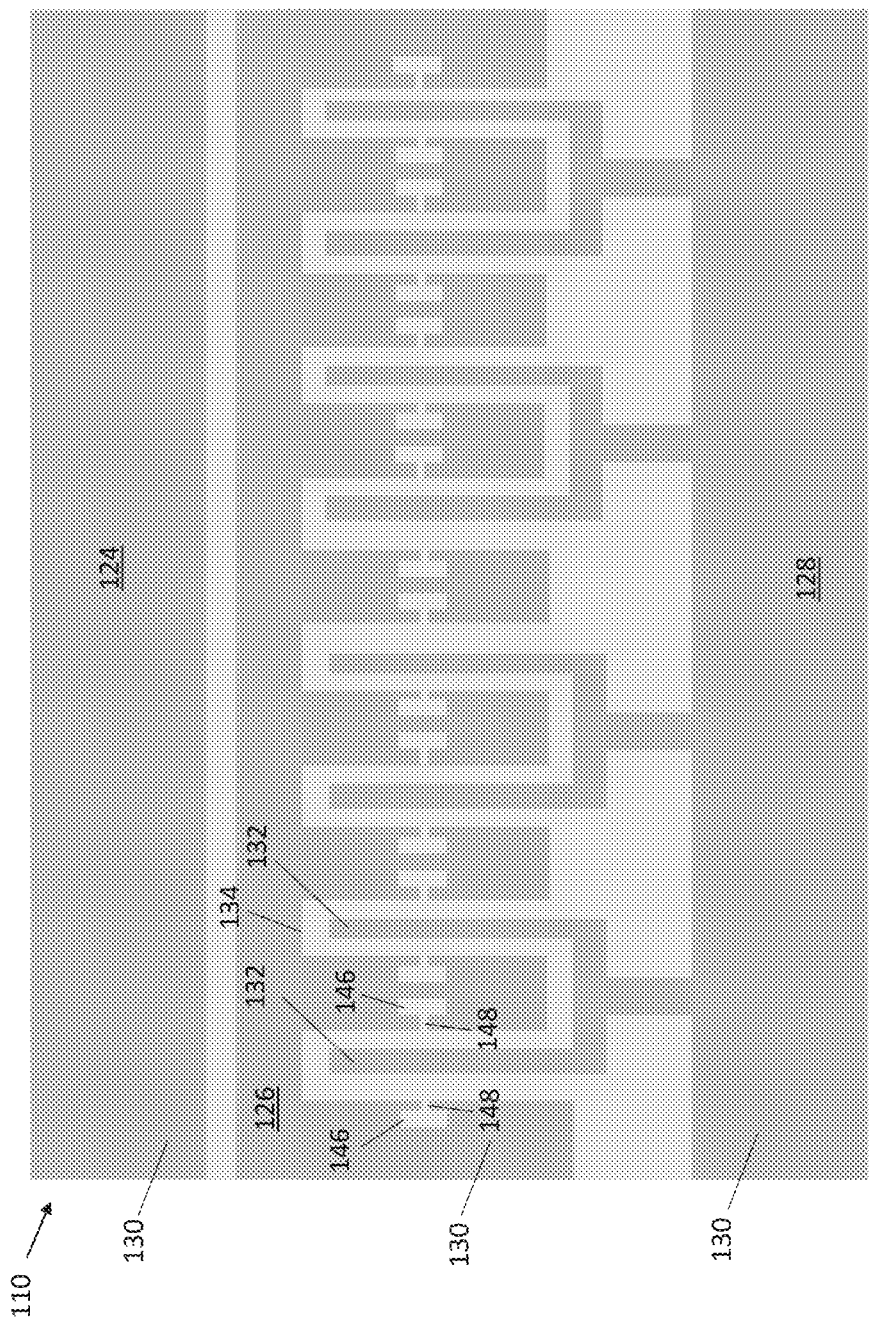
FIG. 4 depicts a plan view representation of a first metallization layer that includes a patterned shape configured to filter harmonic components of an RF signal being formed in the back end of the line portion of the integrated circuit, according to an embodiment.
Figure 5:
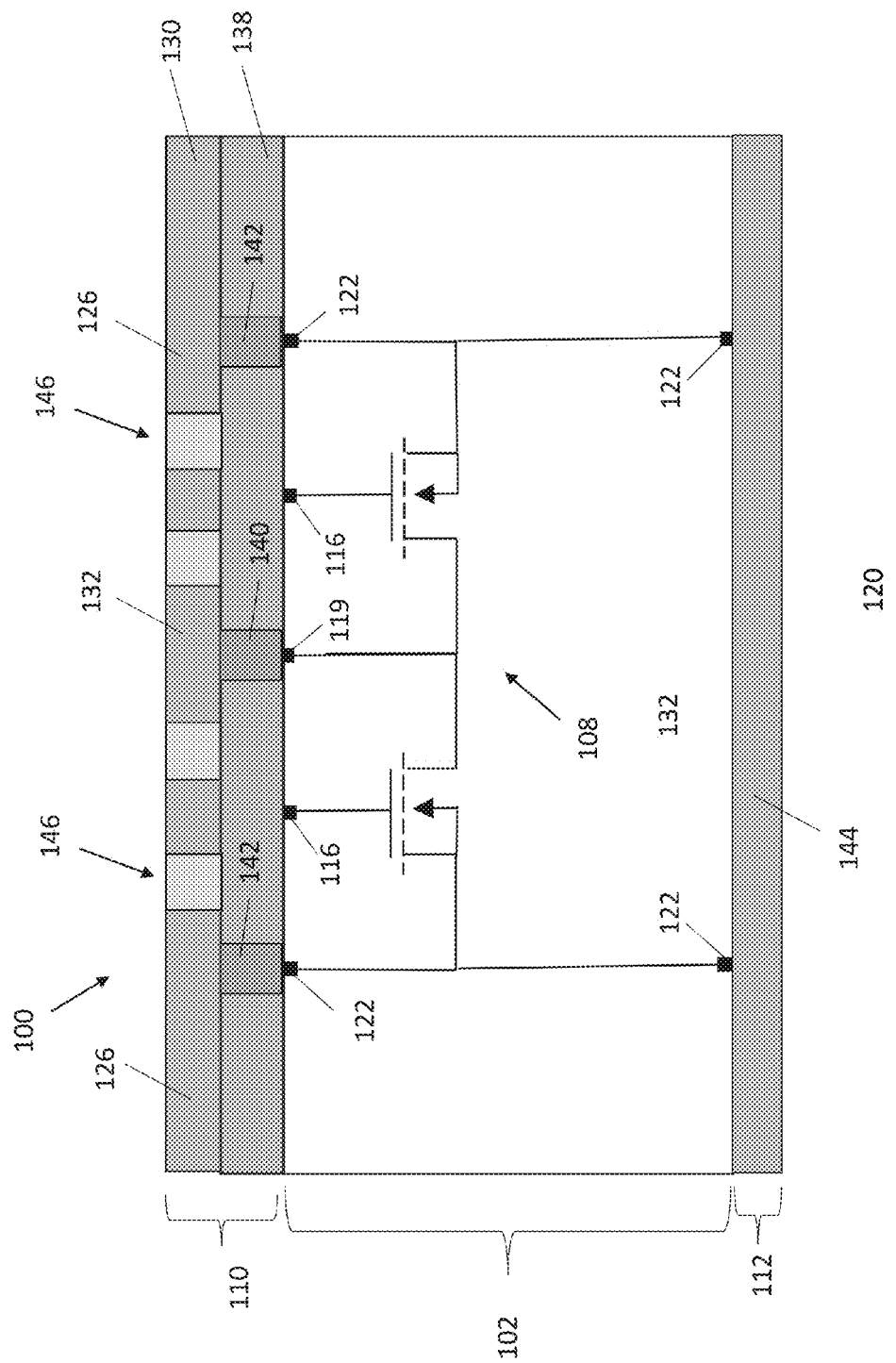
FIG. 5 depicts a cross sectional view of the integrated circuit of FIG. 4, according to an embodiment.

Referring to FIGS. 4-5, integrated circuit 100 is depicted, according to an another embodiment. The embodiment of FIGS. 4-5 is identical to that of FIGS. 2-3, except that patterned shapes 146 have been formed in the reference potential pad 126. The patterned shapes 146 correspond to regions in which the first metallization layer 130 has been removed. That is, the patterned shapes 146 are devoid of metallization. Thus, the ground plane of the coplanar waveguide that is formed by the elongated fingers 132 and the reference potential pad 126. According to an embodiment, the patterned shapes 146 include a connecting section 148 that extends to elongated sides of the reference potential pad 126 that face the elongated fingers 132. As shown in FIG. 5, the voids in the first metallization layer 130 that provides the patterned shapes 146 may be filed with a dielectric material.

The geometry of the patterned shapes 146 can be tailored to influence the frequency response of the coplanar waveguide that is formed by the elongated finger and the reference potential pad 126. An example of this concept is described in J-S Hong, and B. Karyamapudi, "A General Circuit Model for Defected Ground Structures in Planar Transmission Lines," *IEEE Microw. Wireless Comp. Lett.*, vol. 15, no, 10, pp, 706-708, October 2004. To briefly summarize the concept, the ground plane of a coplanar waveguide can be patterned to form a so-called defective ground structure. This defective ground structure alters the impedance response to an AC signal traveling along the conductive track of the coplanar waveguide. The frequency response of a so-called defective ground structure can be modeled as an equivalent LC circuit that includes LC resonators and/or series LC circuits. The parameters of this LC circuit are dependent upon the geometry of the defective ground structure; i.e., the profile of the portion of the ground plane that has been removed. Thus, by tailoring the geometry of the patterned shapes 146 (i.e., the defective ground structure), a desired frequency dependent impedance can be presented to the RF signal that is travelling along the elongated finger.

According to an embodiment, the geometry of the patterned shapes 146 is selected to filter harmonic components of the fundamental frequency of the amplifier device. That is, the patterned shapes 146 has a geometry that presents higher or lower impedance to the harmonics of the fundamental frequency than the frequency ranges that are outside of the harmonics. For instance, the patterned shape can be configured to completely or partially block (i.e., present a very high impedance) to certain higher order harmonics and/or to completely or partially short (i.e., present a very low impedance) to certain higher order harmonics. According to a more particular embodiment, the patterned shapes 146 have a geometry that presents minimal impedance at a second order harmonic of the fundamental frequency and maximal impedance at a third order harmonic of the fundamental frequency. If, for instance, the fundamental frequency is 2.0 GHz, this means that the coplanar waveguide carrying the amplified version of the RF signal appears as an electrical short to ground at 4.0 GHz, and appears as an electrical open at 6.0 GHz. Accordingly, Class F amplifier harmonic filtering of the amplifier device 108 is obtained. These values represent just one example, and a variety of different frequencies and/or frequency responses can be obtained by tailoring the geometry of the of the patterned shapes 146.

Figure 6:
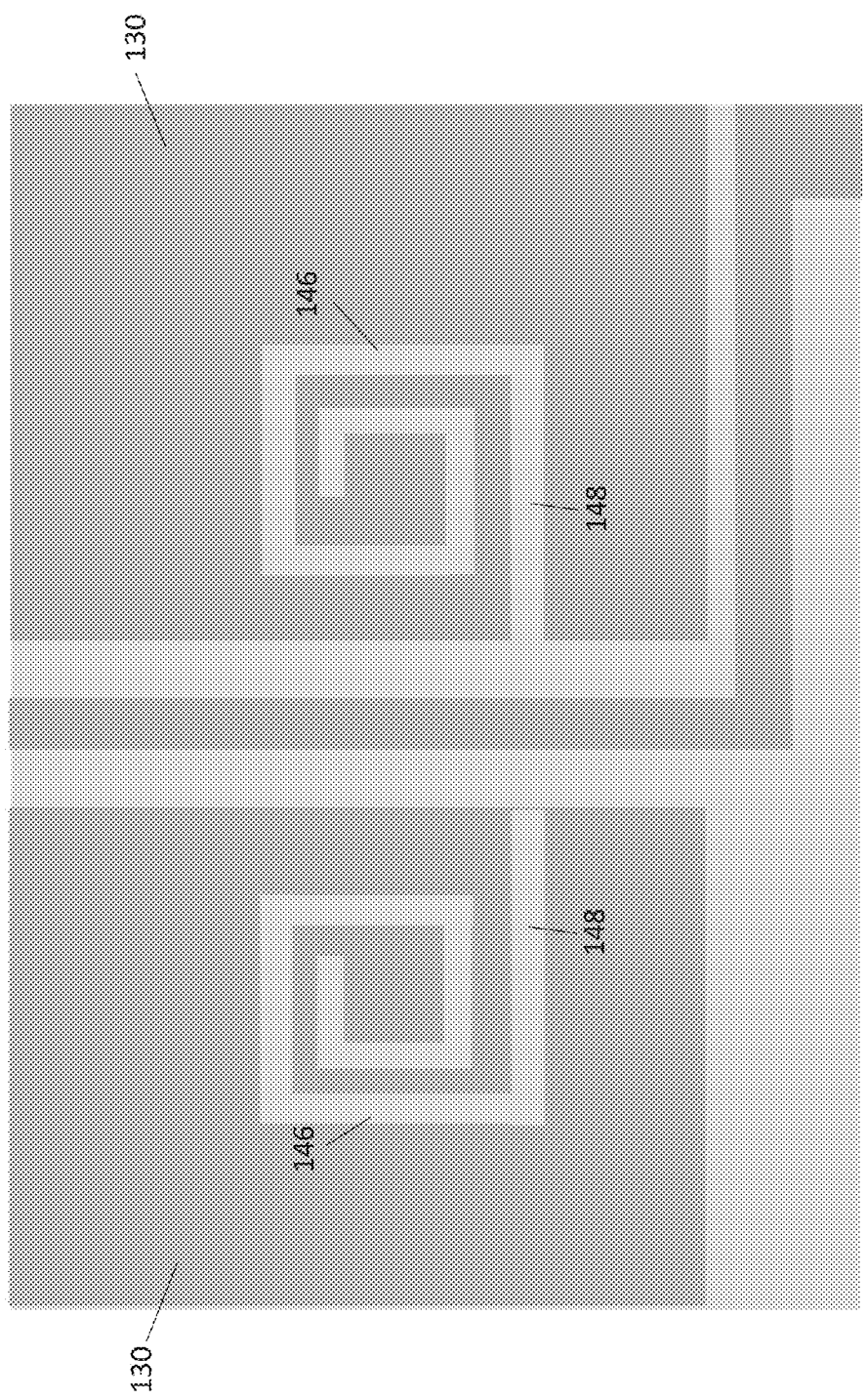
FIG. 6 depicts close up plan view a patterned shape configured to filter harmonic components of an RF signal, according to an embodiment.
Figure 7:
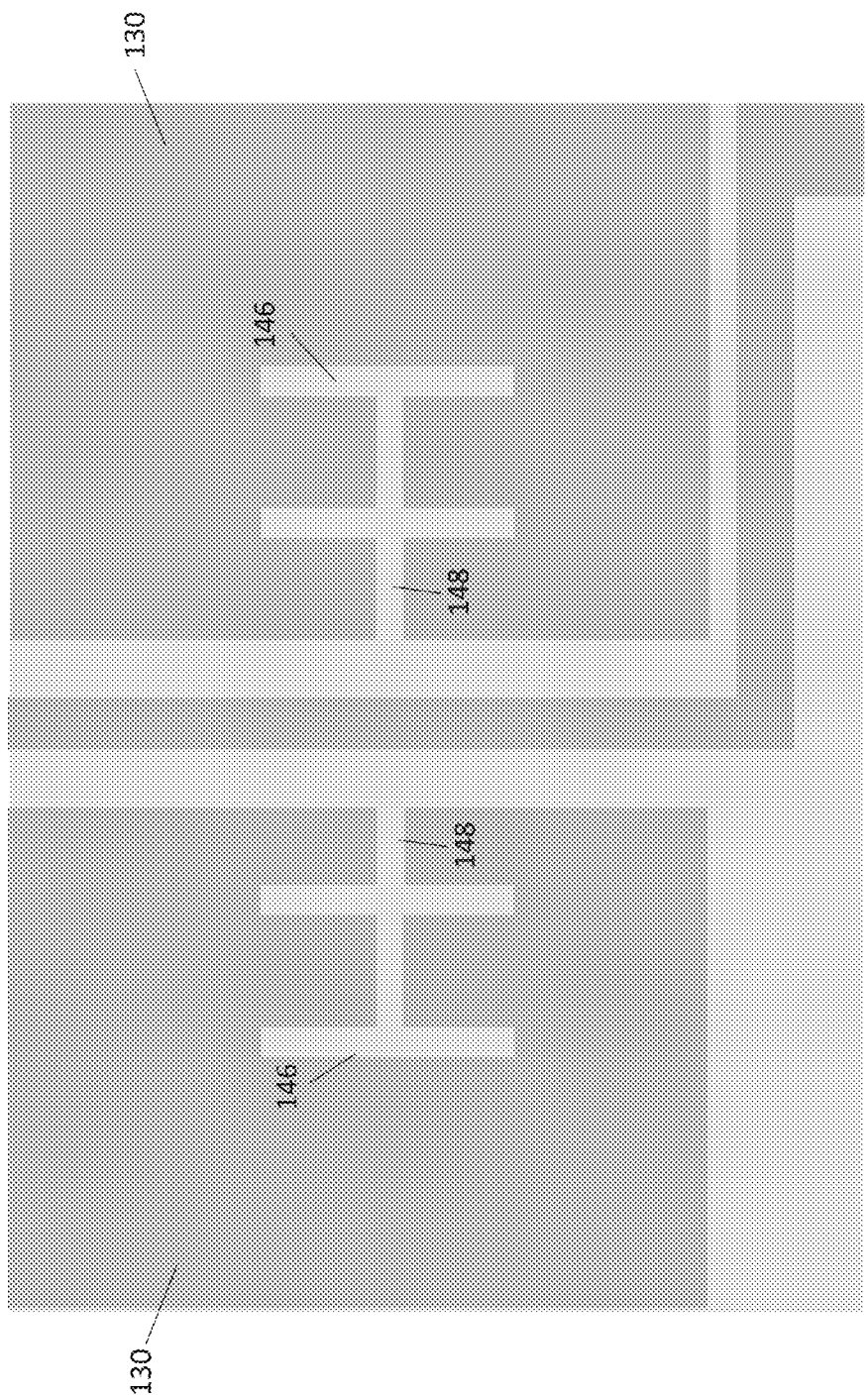
FIG. 7 depicts close up plan view a patterned shape configured to filter harmonic components of an RF signal, according to an embodiment.
Figure 8:
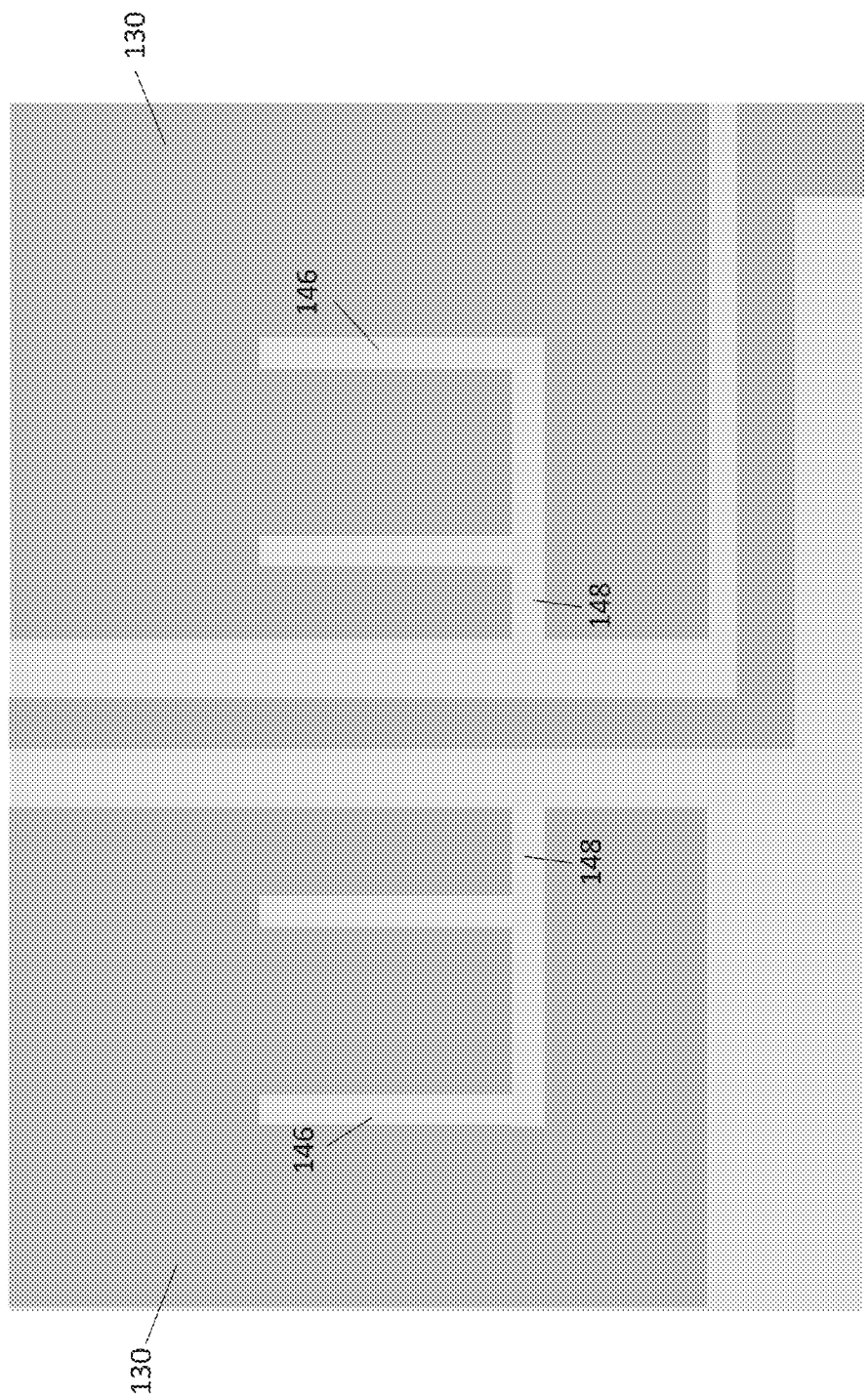
FIG. 8 depicts close up plan view a patterned shape configured to filter harmonic components of an RF signal, according to an embodiment.

Referring to FIGS. 6-8 a close up view of different exemplary geometries for the patterned shapes 146 is depicted. In FIG. 6, the patterned shapes 146 have the geometry of a spiral. In FIG. 7, the patterned shapes 146 have an H-shaped geometry. In FIG. 8, the patterned shapes 146 has an U-shaped geometry. These three geometries represent just a few of a wide variety of possible configurations for the patterned shapes 146. Generally speaking, the patterned shapes 146 can have any geometry that produces a frequency dependent impedance response in the coplanar waveguide.

Figure 9:
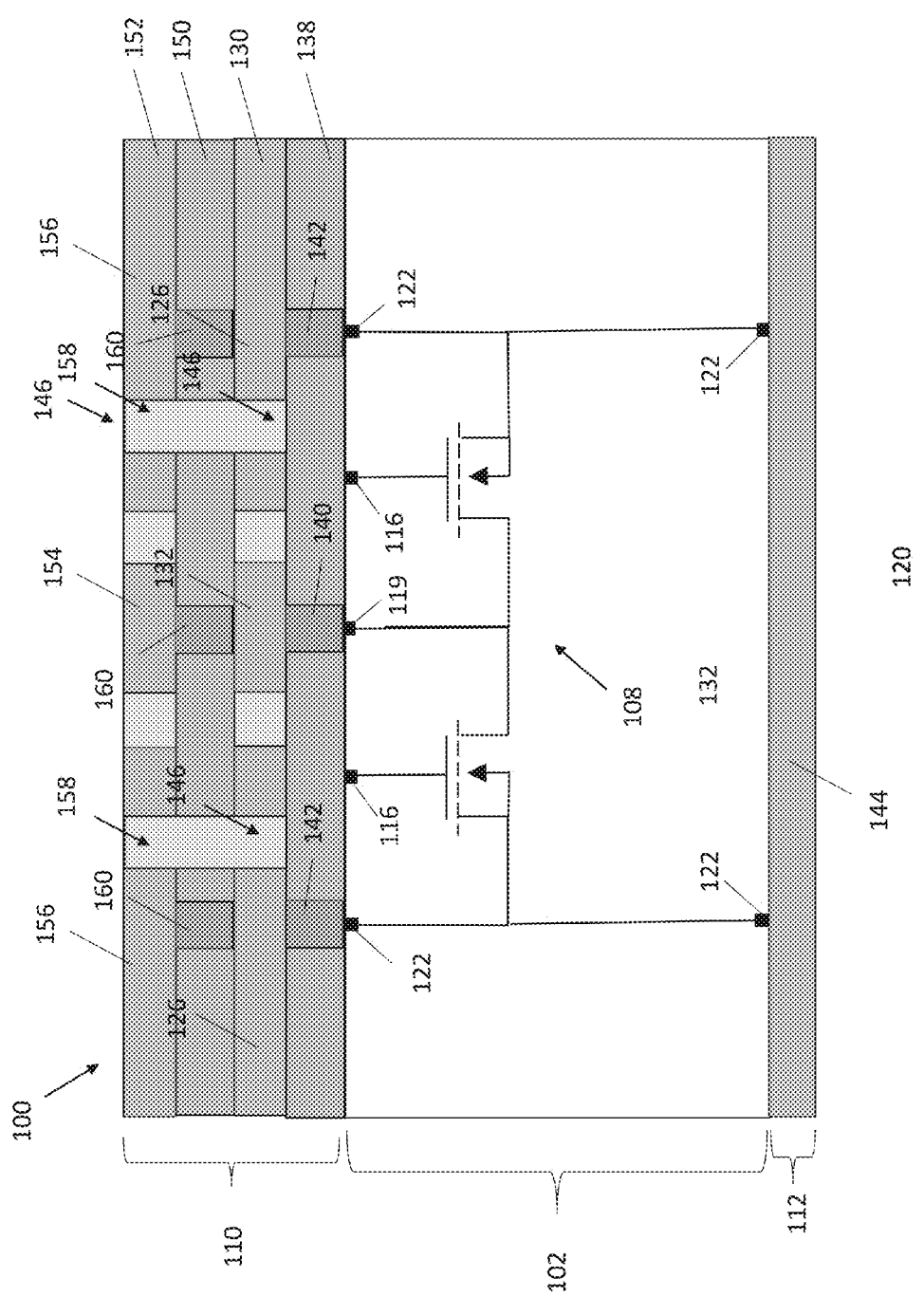
FIG. 9 depicts a cross sectional view of an integrated circuit with a patterned shape configured to filter harmonic components of an RF signal being formed in first and second layers of metallization, according to an embodiment.

Referring to FIG. 9, an integrated circuit 100 is depicted, according to another embodiment. The embodiment of FIG. 9 is identical to that of FIGS. 4-5, except that the coplanar waveguide and defective ground structure concept has been extended to a second level of metallization. More particularly, a second dielectric layer 150 is formed on the first metallization layer 130, and a second metallization layer 152 is formed on the second dielectric layer 150. The second metallization layer 152 is spaced apart from the first metallization layer 130 by the second dielectric layer 150 and is electrically insulated from the first metallization layer 130 by the second dielectric layer 150.

The second metallization layer 152 has been patterned in an identical manner as the first metallization layer 130 previously described. That is, when seen from above, the second metallization layer 152 has the same appearance as the first metallization layer 130 shown in FIG. 4. Thus, the second metallization layer 152 includes a second elongated finger 154 interdigitated with a second reference potential pad 156, and a second patterned shape that is devoid of metallization. Moreover, the features of the second metallization layer 152 are aligned with the features of the first metallization layer 130 such that the second elongated finger 154 and the patterned shapes 158 in the second metallization layer 152 are formed directly over as the patterned shapes 146 and the first elongated fingers 132 in the first metallization layer 130. A second set of via structures 160 are used to provide an electrical connection between the first and second elongated fingers 132, 154 and between the first and second reference potential pads 126, 156. In this embodiment, the first and second metallization layers 130, 152 collectively provide the coplanar waveguide and harmonic filtering described herein. Of course, this configuration behaves differently than the single metallization layer embodiment described with reference to FIG. 4 due to, e.g., due to the differences in electrical resistance, electromagnetic effects, etc. However, these effects can be accounted for and modeled to provide a desired frequency response.

Figure 10:
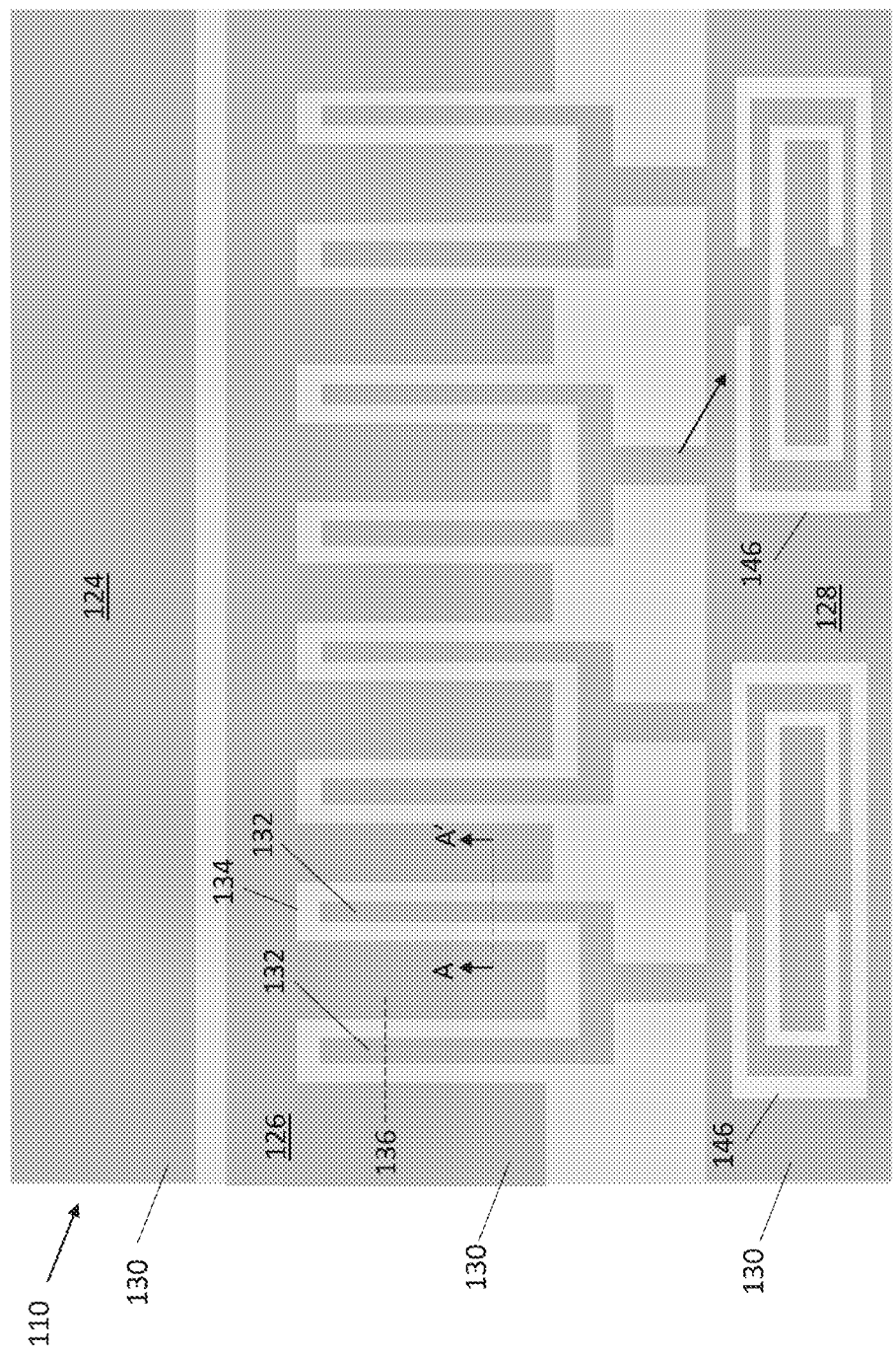
FIG. 10 depicts a plan view of an integrated circuit with a patterned shape configured to filter harmonic components of an RF signal being formed in a reference potential pad that is disposed on a rear side of the substrate, according to an embodiment.

Referring to FIG. 10, an integrated circuit 100 is depicted, according to another embodiment. The embodiment of FIG. 10 is identical to that of FIGS. 4-5, except that the patterned shape 146 is not formed in the reference potential pad 126. Instead, the patterned shape 146 is formed in the output terminal pad 128.

The patterned shape 146 shown in FIG. 10 is a so-called square-ring-split-resonator. This geometry represents just one example of the possible shapes for a patterned shape 146 to the output terminal pad 128. In general, the geometry of the patterned shape 146 in the output terminal pad 128 can be modeled as an equivalent LC circuit according to the previously described techniques to provide a desired frequency response.

In the above described embodiments, an integrated circuit includes a patterned shape that provides harmonic filtering and is formed in a first-level metallization layer (FIG. 5) and also in a second-level metallization layer (FIG. 9). This principle is not limited to these specific metallization configurations. More generally, the integrated circuit can include any number of metallization layers, e.g., three, four, five, etc. and the patterned shape that provides harmonic filtering can be formed in one, more than one, or all of these metallization layers. The metallization layers that do not include the patterned shape can be used for other electrical connections in which a frequency dependent impedance response is not desired or needed, for example. Moreover, the patterned shape does not necessarily have to have the same geometry or location in the various metallization layers. More than one patterned shape can be provided in separate metallization layers to provide two distinct frequency responses.

The BEOL portions of the integrated circuit described herein may be formed according to any conventionally known technique. For instance, the dielectric layers and the metallization layers can be formed by conventionally known deposition techniques. After deposition, these layers can be structured using conventionally known lithography techniques including masked etching. In general, the geometry of the patterned shapes is limited to any geometry that is within the capability of these patterning techniques.

The term "electrically connected" describes a permanent low-ohmic, i.e., low-resistance, connection between electrically connected elements, for example a wire connection between the concerned elements. An electrical connection is nominally a zero impedance connection. By contrast, the term "electrically coupled" contemplates a connection in which there is not necessarily nominally zero impedance connection between coupled elements. For instance, active elements, such as transistors, as well as passive elements, such as inductors, capacitors, diodes, resistors, etc., may electrically couple two elements together.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device, comprising:
a semiconductor substrate comprising first and second opposite facing surfaces;
an amplifier device being formed in the semiconductor substrate, the amplifier device being configured to amplify an RF signal at a fundamental frequency;
a first dielectric layer formed on the first surface of the substrate;
a first metallization layer formed on the first dielectric layer, the first metallization layer being spaced apart from the substrate by the first dielectric layer,
wherein the first metallization layer comprises a first elongated finger interdigitated with a first reference potential pad, the first elongated finger being physically disconnected from the first reference potential pad,
wherein the first reference potential pad comprises a first patterned shape that is devoid of metallization, and
wherein the first patterned shape has a geometry that filters harmonic components of the fundamental frequency.

2. The semiconductor device of claim 1, wherein the amplifier device comprises a transistor comprising an input terminal, an output terminal, and a reference potential terminal, wherein the elongated finger is electrically connected to the output terminal, and wherein the first reference potential pad is electrically connected to the reference potential terminal.

3. The semiconductor device of claim 2, wherein the first patterned shape connects to and extends away from at least one of the elongated sides of the first reference potential pad.

4. The semiconductor device of claim 3, wherein the patterned shape comprises at least one of: a spiral, an H-shape, and a U-shape.

5. The semiconductor device of claim 2, wherein the semiconductor device further comprises an externally accessible input terminal pad, an externally accessible output terminal pad, and an externally accessible reference potential pad, wherein the elongated finger is electrically connected to the output terminal of the RF transistor and the externally accessible output terminal pad, and wherein the reference potential pad is electrically connected to the externally accessible reference potential pad and the reference potential terminal.

6. The semiconductor device of claim 2, further comprising:
a second dielectric layer formed on the first metallization layer;
a second metallization layer formed on the second dielectric layer, the second metallization layer being spaced apart from the first metallization layer by the second dielectric layer,
wherein the second metallization layer comprises a second elongated finger interdigitated with a second reference potential pad,
wherein the second reference potential pad comprises a second patterned shape that is devoid of metallization,
and wherein the second elongated finger and the second patterned shape are formed directly over and have the same geometry as the first patterned shape and the first elongated finger.

7. The semiconductor device of claim 2, wherein the first patterned shape has a geometry that presents minimal impedance at a second order harmonic of the fundamental frequency and maximal impedance at a third order harmonic of the fundamental frequency.

8. An integrated circuit, comprising:
a semiconductor substrate comprising first and second opposite facing surfaces;
an RF transistor formed in the semiconductor substrate, the RF transistor being configured to operate at a fundamental frequency, and comprising a control terminal, an output terminal and an reference potential terminal;
an externally accessible control terminal that is electrically connected to the control terminal, an externally accessible output terminal that is electrically connected to the output terminal, and an externally accessible reference potential terminal that is electrically connected to the reference potential terminal;
a first patterned shape that is devoid of metallization being formed in a back end of the line metallization layer of the integrated circuit,
wherein the first patterned shape has a geometry that filters harmonic components of the fundamental frequency.

9. The integrated circuit of claim 8, further comprising:
a first dielectric layer formed on the first surface of the substrate;
a first metallization layer formed on the first dielectric layer, the first metallization layer being spaced apart from the substrate by the first dielectric layer,
a first reference potential pad, a first output terminal pad, a first control terminal pad, and a first elongated finger,
wherein the first reference potential pad, the first output terminal pad, the first control terminal pad, and the first elongated finger are each formed in the first metallization layer,
wherein the first reference potential pad is electrically connected to the reference potential terminal and the externally accessible reference potential terminal,
wherein the first output terminal pad is electrically connected to the output terminal and the externally accessible output terminal,
wherein the control terminal pad is electrically connected to the control terminal and the externally accessible control terminal, and
wherein the first elongated finger physically connects to the first output terminal pad and is interdigitated with the first reference potential pad.

10. The integrated circuit of claim 9, wherein the first patterned shape is formed in the first reference potential pad.

11. The integrated circuit of claim 10, wherein the first patterned shape is formed in the first output terminal pad.

12. A method of forming a semiconductor device, comprising:
providing a semiconductor substrate comprising first and second opposite facing surfaces and an amplifier device that is configured to operate at a fundamental frequency, the amplifier device comprising a control terminal, an output terminal and a reference potential terminal;
forming a back end of the line metallization layer on the semiconductor substrate;
forming a first patterned shape in the back end of the line metallization layer,
wherein the first patterned shape has a geometry that filters harmonic components of the fundamental frequency.

13. The method of claim 12, wherein forming the back end of the line metallization layer comprises depositing the back end of the line metallization layer, and wherein forming the first patterned shape comprises etching portions of the back end of the line metallization layer away after depositing the back end of the line metallization layer.

14. The method of claim 12, wherein the first patterned shape has a geometry that presents minimal impedance at a second order harmonic of the fundamental frequency and maximal impedance at a third order harmonic of the fundamental frequency.

15. The method of claim 12, further comprising:
forming a first dielectric layer formed on the first surface of the substrate;
forming a first metallization layer on the first dielectric layer, the first metallization layer being spaced apart from the substrate by the first dielectric layer,
forming a first reference potential pad, a first output terminal pad, a first control terminal pad, and a first elongated finger in the first metallization layer,
wherein the first reference potential pad is electrically connected to the reference potential terminal,
wherein the first output terminal pad is electrically connected to the output terminal,
wherein the control terminal pad is electrically connected to the control terminal, and
wherein the first elongated finger physically connects to the first output terminal pad and is interdigitated with the first reference potential pad.

16. The method of claim 15, wherein the first patterned shape is formed in the first reference potential pad.

17. The method of claim 15, wherein the first patterned shape is formed in the first output terminal pad.

* * * * *